United States Patent [19]

Cox

[11] Patent Number: 4,574,093
[45] Date of Patent: Mar. 4, 1986

[54] DEPOSITION TECHNIQUE

[75] Inventor: Herbert M. Cox, Berkeley Heights, N.J.

[73] Assignee: AT&T Bell Laboratories, Murray Hill, N.J.

[21] Appl. No.: 566,918

[22] Filed: Dec. 30, 1983

[51] Int. Cl.⁴ .................... B05D 5/12; C23C 16/00
[52] U.S. Cl. .................................. 427/86; 427/85; 427/87; 427/248.1; 427/255; 427/255.2; 427/255.5; 427/255.7
[58] Field of Search .............. 427/248.1, 255, 255.2, 427/255.5, 85, 86, 87, 8, 9, 299; 428/411, 699, 938

[56] References Cited

U.S. PATENT DOCUMENTS

| | | | |
|---|---|---|---|
| 3,663,320 | 5/1972 | Maruyama et al. | 427/255.2 |
| 3,922,467 | 11/1975 | Pinchon | 427/255 |
| 4,148,939 | 4/1979 | Korjukin et al. | 427/248.1 |
| 4,273,812 | 6/1981 | Tsutsui et al. | 427/248.1 |
| 4,315,960 | 2/1982 | Ohji et al. | 427/248.1 |

*Primary Examiner*—S. L. Childs
*Attorney, Agent, or Firm*—Bruce S. Schneider

[57] ABSTRACT

Deposited layers are advantageously obtained by utilizing a specific vapor deposition procedure. In this procedure, a substrate is positioned a relatively short distance from the source of a gas flow capable of producing the desired deposition. This gas flow is directed so that it contacts an interior region of the substrate and moves from the initial contact point to a point on the periphery of the substrate. Exemplary of such gas flow configurations is the positioning of a substrate at a small distance above a fused quartz frit through which the deposition gas flow is directed.

11 Claims, 15 Drawing Figures

DEPOSITION TECHNIQUE

BACKGROUND OF THE INVENTION

1. Field of the Invention

The invention relates to material deposition and, in particular, to material vapor deposition.

2. Art Background

Figure 1:
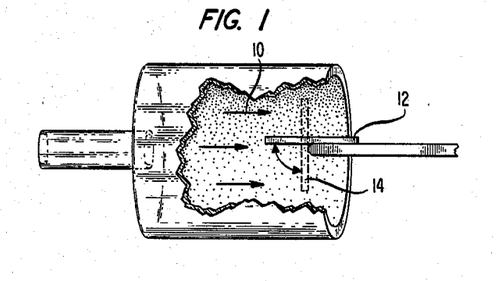
FIGS. 1 through 3, 6, 14, and 15 are illustrative of spatial configurations utilized in vapor deposition techniques reported in the literature.

Many processes have been developed for the deposition of materials, e.g., semiconductor materials, on a substrate. On such process involves the use of a precursor gas, i.e., a gas that upon contact with the substrate undergoes a modification such as a chemical reaction to yield a deposited layer. (Typically, the precursor gas is a mixture of gaseous components.) In these vapor deposition processes, generally, the gas flow and its spatial relationship to the substrate are carefully controlled. For example, in the most common spatial configuration employed in chemical vapor deposition (CVD), a gas flow is established at one end of a vessel, a substrate is placed within the vessel, as shown in FIG. 1, and a gas flow is established in the direction of arrows, 10, parallel to the major surface of the substrate, 12. In an alternative configuration employed in CVD processes, the substrate is positioned as shown by phantom substrate, 14, so that the flow direction is generally perpendicular to the major surface of the substrate. The first configuration, i.e., the parallel configuration, is most commonly used because it introduces the least perturbation in the precursor gas flow. However, the latter configuration is at times employed when it is desired to minimize the temperature gradient across the substrate introduced by the corresponding axial temperature gradient in the reactor. In one spatial variation, the substrate is canted to a position between parallel and perpendicular in an attempt to combine the advantages of each configuration.

Figure 2:
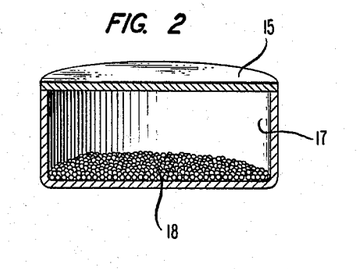

In another variation, generally denominated close space deposition, a sublimable material is placed at the bottom of a vessel, such as shown in FIG. 2, with the vessel dimensions chosen so that they are essentially coextensive with the dimensions of the substrate, 15. The substrate is held above this vessel, 17, and a vapor is produced by heating the material, 18, and thus inducing sublimation. The resulting vapor diffuses through the vessel and produces film deposition on a substrate maintained at a temperature below that of the subliming material. Close space deposition is typically employed when apparatus simplicity is desired, but it often leads to control difficulties, e.g., thickness and compositional irregularities.

Figure 3:
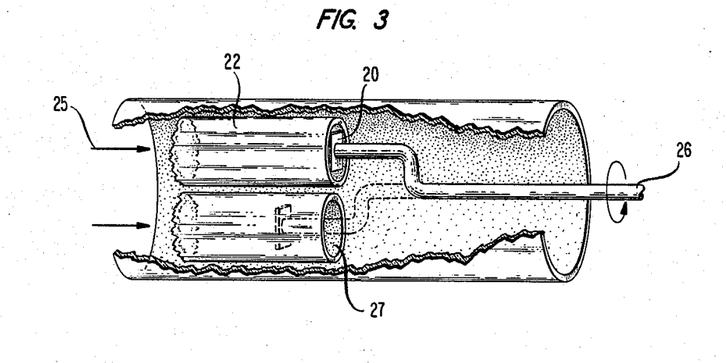

Other configurations are also utilized for specific applications, such as those requiring deposition of a plurality of compositionally dissimilar layers. For example, the configuration shown in FIG. 3 has also been employed. (See "Vapor Phase Epitaxy of III-V Compound Optoelectronic Devices," by G. H. Olsen in *Proceedings on the Symposium on III-V Opto-electronics Epitaxy and Device Related Processes*, edited by V. G. Keramidas and S. Mahajan, Vol. 83-13, Electrochemical Society, pages 231-251 (1983) for a detailed description.) Basically, the substrate, 20, is positioned at the orifice of a tube, 22, so that its major surface is perpendicular to the long axis of the tube. The precursor gas flow, 25, is then directed along the tube, emerges from the tube, and contacts the substrate. If two such tubes are employed, then it is possible to establish different precursor gas flows through each tube. By a translational shift such as an eccentric rotation around an external shaft as shown at 26, the substrate is first subjected to one gas flow and then to the second at 27. In this manner, deposited layers having different compositions are sequentially formed on a substrate. In one modification, the substrate is actually inserted into the tube in a parallel, perpendicular, or intermediary configuration, and when a composition change is desired, the substrate is withdrawn, rotated eccentrically, and inserted in the second tube. These dual tube techniques produce transitional regions between layers with a compositional gradient that is less severe than that obtained by changing the precursor gas in the previously discussed single gas flow methods. However, in any of the multiple tube techniques, translation of the substrate induces substantial gas flow perturbation. These perturbations induce contamination of one gas flow by the other, and produce a generally undesirable transitional region rather than producing a relatively abrupt compositional change between layers.

Each deposition configuration has been designed to achieve specific objectives and each has been used for specific applications. However, it is desirable to improve layer uniformity and to reduce transitional regions between layers. It is also certainly desirable to enhance the flexibility of processes to achieve the combined attributes of a variety of existing techniques.

SUMMARY OF THE INVENTION

Through the use of a specific gas flow pattern and a specific spatial configuration, deposited layers with excellent characteristics, e.g., compositional and thickness uniformity, are produced in a system that is adaptable to many uses including the expeditious production of multilayer structures with relatively abrupt compositional changes between layers. These advantages are achievable by positioning the substrate so that (1) the surface directing the gas flow which ultimately yields the deposited layer is spaced from the deposition surface of the substrate no further than an average distance equivalent to ¼, preferably no further than 1/10, the effective radius of the substrate and so that (2) at least 50 percent of the gas that ultimately contacts the substrate in a region where deposition is desired contacts this region before it cuts an imaginary surface that is tangent at all points along the periphery of the substrate and normal to the deposition surface. (The effective substrate radius is the radius of an imaginary circle having the same area as the surface of the substrate upon which deposition is to be accomplished.)

Figure 4:
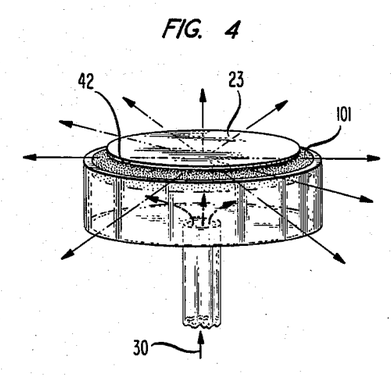
FIGS. 4, 5, 7, and 8 through 13 are illustrative of the invention deposition configuration and the results achieved.

Exemplary of configurations which satisfy these criteria is the use of a porous baffle, 101, in FIG. 4, e.g., a frit, having relatively small passages, i.e., passages with cross sections typically less than 1/10 the substrate effective radius, where the substrate, 23, is spaced from the frit, 101, a distance again less than ¼, preferably less than 1/10, the effective substrate radius. A gas precursor is established on the side of the frit opposite from the substrate, flows through the frit, contacts the substrate, and then flows along the substrate surface to its periphery where it escapes. This contact between precursor gas and the substrate major surface facing the frit produces deposition of a layer on this major surface with quite good thickness and compositional uniformity, e.g., variations of less than 3 percent for thickness and 0.5 percent for composition across a 2-inch diameter substrate having a nominal composition $In_{0.53}Ga_{0.47}As$ layer grown on an indium phosphide substrate. (Contact of the substrate with the directing surface that severely limits flow in not desirable, but not precluded, since it reduces uniformity.) By introducing different gas flows in separated regions of the frit, e.g., by having separate chambers directing separate gas flows through the frit regions, successive layers are deposited simply by maintaining the substrate over the frit region of a first gas flow and after a suitable time moving the substrate to the region of the second gas flow. This movement is a simple translational motion and is easily accomplished.

In a preferred embodiment, it is possible to actually suspend or levitate the substrate over the frit using the pressure of the precursor gas itself. Thus, the substrate is not mechanically held over the frit, but the pressure of the gas emanating from the frit and flowing to the substrate periphery is utilized to suspend the substrate. The gas flow is adjusted so that the pressure produced by the gas in the region between the frit and the substrate as it passes through the region is sufficient to levitate the substrate. For typical gas flows and for common substrate dimensions, e.g., 2-inch diameter III-V semiconductor substrate or larger, with a thickness less than 25 mils, levitation is accomplished with spacings between the directional surface and the substrate of 1/50 or less of the effective substrate radius. Since the substrate is suspended, movement of the substrate from one frit region to a second frit region, or from one area of the reactor to another, is easily accomplished through a mechanical movement or through the use of a secondary gas flow not employed for deposition but merely employed to induce a movement in a desired direction. Additionally, it is possible to employ a secondary gas flow to induce rotation of the substrate during deposition and thus to further enhance the uniformity of the deposited layer.

DETAILED DESCRIPTION

Figure 5:
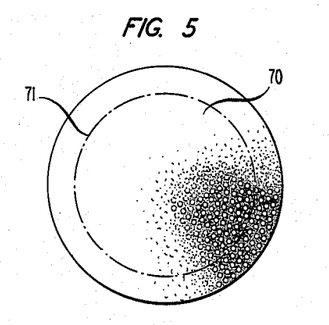
Figure 14:
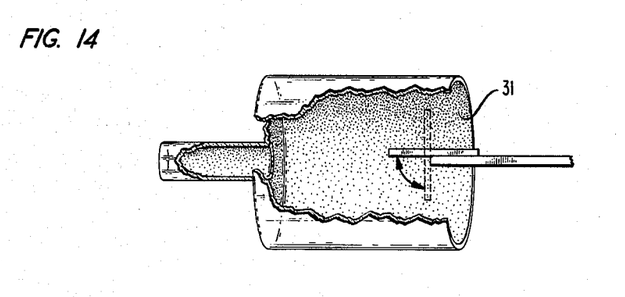
Figure 15:
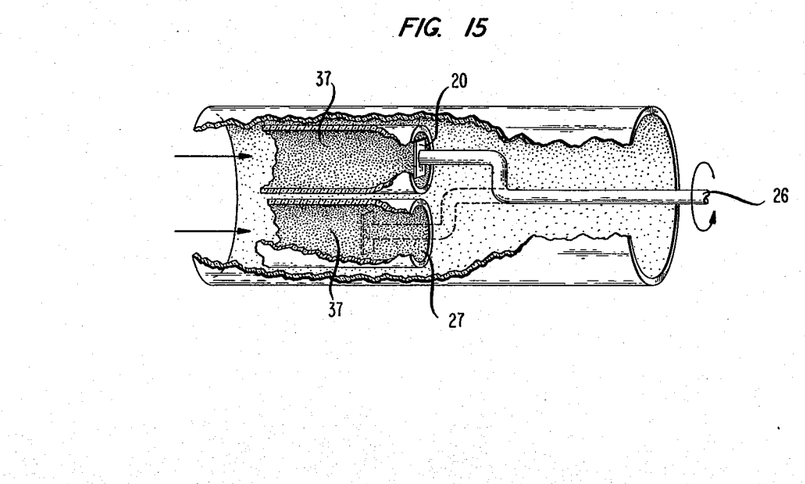

To obtain the extremely desirable advantages of the invention, two criteria should be satisfied. These criteria involve (1) the average distance between the gas-directing-surface and the surface of the substrate upon which the deposition is desired, and (2) at least 50 percent of the gas that ultimately contacts the substrate in a region where deposition is desired contacts this region before it cuts an imaginary surface that is tangent at all points along the periphery of the substrate and normal to the deposition surface. The first criterion is satisfied if the average distance from the surface directing the gas flow to the substrate (measured from each point in the directing surface to the closest point on the deposition surface of the substrate) should be less than ¼, preferably less than 1/10, most preferably less than 1/50, the effective substrate radius. The directing surface is defined in a very specific manner. In particular, an imaginary sphere having a diameter of 1/10 the substrate radius is traversed starting from the point closest to the substrate along all accessible surfaces that direct the flow of at least a portion of the precursor gas in a direction that induces direct contact of the gas with the deposition surface. (If there is a plurality of points equally close, then one of these points is chosen at random. A surface is not accessible if it is not possible for the sphere to physically reach the surface upon translation, assuming the sphere is solid and non-deformable where the substrate itself is neither considered a barrier to movement nor is it considered accessible.) The directing surface is defined by all points touched by the sphere. Thus, for example, in the configuration of FIG. 1, the imaginary sphere rolls along tube surfaces in FIG. 14, and the shaded directional surface, 31, is determined. Similarly in the configuration of FIG. 3, the sphere rolls along surfaces in FIG. 15, defining surfaces indicated by the shaded regions, 37. Clearly these surfaces lead to a violation of the first criterion. On the other hand, for the embodiment of the inventive process shown in FIG. 4 where a frit having orifice size less than 1/10 the effective substrate radius is utilized, the sphere rolls along the surfaces, as shown in the plan view of FIG. 5, with phantom substrate, 70, indicated by dashed circle, 71, and slightly dips into each surface orifice but does not fit through these holes. Thus, a surface is defined, as shown by the shaded region, that leads to satisfaction of the first criterion. (It should be noted that this surface has holes in it where the sphere does not touch a gas-directing-member. These hole regions are not considered in determining the average distance to the substrate deposition surface. It should also be noted that the holes in FIG. 5 have been exaggerated for purposes of clarity and are generally significantly smaller relative to the size of the substrate. Also, for simplicity, holes and shading are shown in only a portion of the frit.)

Figure 6:
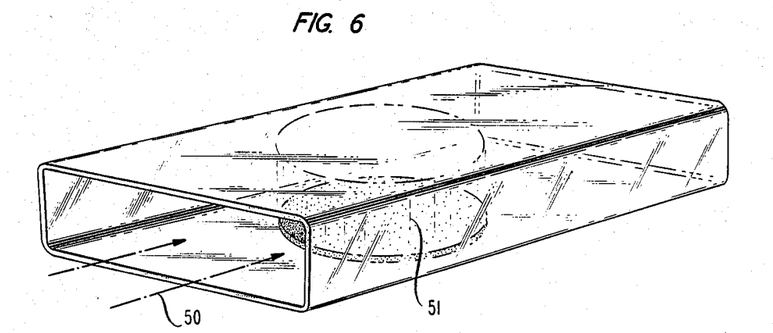

The second criterion is satisfied if at least 50 percent of the gas contacting the substrate in the region where growth is desired has its first point of contact with the substrate at an interior region of the substrate (i.e., a region that is greater than 1/100 of the substrate effective radius from the closest point on the periphery of the substrate) before it cuts an imaginary surface that is tangent to the substrate periphery and normal to the deposition surface. Thus, for example, as shown in FIG. 4, the gas, as shown by arrows emanating from the frit, contacts the substrate almost entirely on its surface and then flows along its surface eventually reaching its periphery, 42. In contrast, the configuration of FIG. 6 neither satisfies the first criterion nor does it satisfy this second condition since initial contact of gas flowing in direction, 50, first cuts the previously described imaginary surface, 51.

Figure 7:
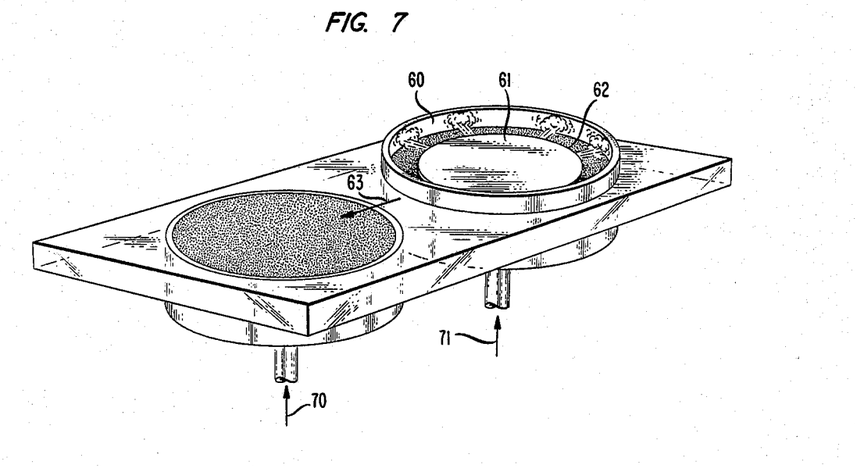

Obviously, many configurations are possible which satisfy the inventive criteria. In one embodiment of the subject invention, the substrate is mechanically held below the source of gas, e.g., a frit having holes less than 1/10 the effective radius of the substrate, by mechanical means. In one particularly advantageous embodiment, the precursor gas flow itself is utilized to maintain the desired distance between the gas-flow-directing-surface and the deposition surface. In this embodiment, the gas flow is adjusted so that it is sufficient to levitate the substrate above the frit. The gas flow is adjusted so that levitation maintains the substrate at an average distance that is less than ¼, preferably less than 1/10, the effective substrate radius from the locus of the directing surface. Typically, for frits having orifices with cross-sectional dimensions in the range 100 $\mu$m to 150 $\mu$m, distances in the range 0.01 mm to 0.5 mm are maintainable utilizing nominal gas flows for substrates of 2-inch diameter. (Gas flow in regions of the frit not contributing to levitation obviously increases the total flow required and is generally advantageously limited.) By this method, no mechanical means are required to maintain the substrate in the proper position relative to the directing surface, and possible damage produced through the use of such mechanical bodies is not encountered. Additionally, it is possible to move the levitated substrate from one region of the frit to another by the use of a mechanical translator or a directed gas flow. For example, as shown in FIG. 7, a translator, 60, contacts the substrate, 61, at 62 and causes a translational motion in direction, 63, by a corresponding motion of the translator. In another embodiment, movement is achieved by utilizing directional gas flows that do not induce deposition. Additionally, by establishing different gas flows, 70 and 71, in different laterally isolated frit regions, also shown in FIG. 7, it is possible to first deposit a layer of one composition and then by translating the substrate to a second region, produce an overlying layer of a second composition.

The composition of the precursor gas flow is not critical to the use of the invention. Compositions such as used in CVD or in other gas deposition processes are employable. If, for example, it is desired to deposit (1) indium phosphide, (2) gallium arsenide, (3) gallium indium arsenide, or (4) gallium indium arsenide phosphide, then gas flows predominately containing, respectively, (1) InCl, $P_2$, $P_4$, and $H_2$, (2) GaCl, $H_2$, and $As_4$, (3) GaCl, InCl, $As_4$, and $H_2$, and (4) InCl, GaCl, $P_2$, $P_4$, $As_4$, and $H_2$ are employed. (If desired, dopants are also introduced utilizing conventional dopant precursor gases, e.g., 600 ppm hydrogen sulfide in hydrogen.) By this method it is possible to deposit semiconductor material such as III-V semiconductor materials as well as materials such as silicon. However, conditions should be avoided that cause significant blockage of the gas flow by, for example, substantial deposition in the porous passages of the frit. Contact with a gas flow producing a desired deposition is continued until a desired thickness is achieved. Deposition is then discontinued by, for example, terminating the gas flow or translating the substrate away from the gas flow.

The following examples are illustrative of the subject invention.

EXAMPLE 1

A 2-inch in diameter gallium arsenide substrate having its major surface 6 degrees off the [100] plane toward the [110] plane was cleaned by sequentially immersing it forface 6 degrees off the [100] plane toward the [110] plane was cleaned by sequentially immersing it for 15-minute intervals in boiling trichloroethylene, boiling acetone, and boiling methanol. The substrate was then immersed for a period of 2 minutes in a 5 parts by volume sulfuric acid, 1 part hydrogen peroxide (30 percent in water), and 1 part deionized water solution. The cleaned substrate was rinsed in deionized water and then spun dry.

Figure 8:
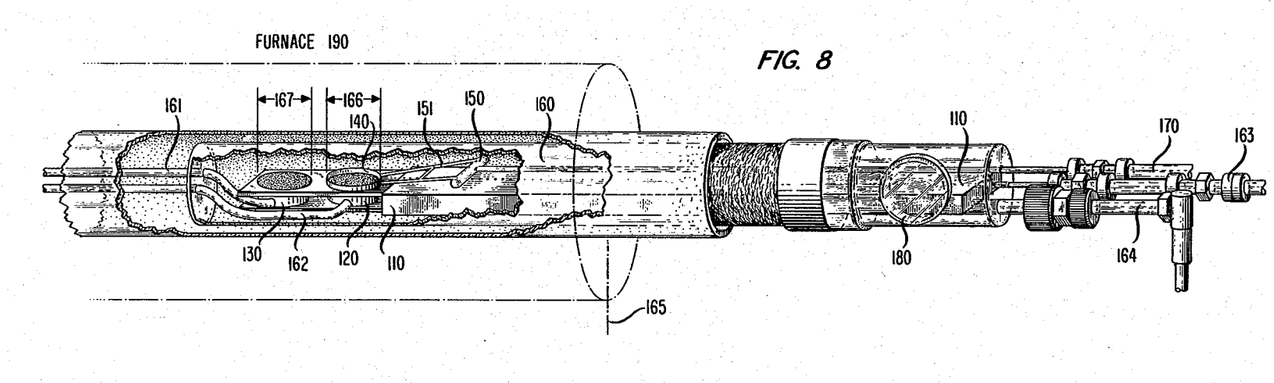

A helium flow of approximately 4 liters/minute was established through the growth apparatus. This growth apparatus, as shown in FIG. 8, included a levitation track, 110, and two growth chambers, 120 and 130. The levitation track was a rectangular quartz tube approximately 2¾ inches×7/8 inches in cross section and 29 inches long. The tube was sealed except for a gas inlet port and except for a series of holes 30 mils in diameter positioned in the top surface of the track centered in this surface and spaced so that there were approximately 4 holes/inch. The levitation track was fused to a body containing two deposition regions. The deposition regions were constructed by first sealing a quartz frit measuring 60 mm in diameter and 6 mm in thickness into the end of a quartz tube having an inside diameter of approximately 60 mm. (The frit had a pore size of approximately 120 µm and was purchased from Heraus Amersil under the trade name Porous Disk, Porosity 1.) A quartz plate having dimensions 3 inches×5 inches was prepared by forming two holes (60 mils in diameter) through the plate. The tubes with the frits were then sealed in these holes, with the frit approximately coplanar with the major surface of the plate. The entire structure was then ground so that it was substantially coplanar. Each tube exiting the plate was then reduced to an inlet size of approximately 10 mm. A quartz ring having an inside diameter of approximately 55 mm and a thickness of approximately ⅛ inch was utilized as a translator for the substrates. This translator, 140, was initially positioned, as shown in FIG. 8. A roller, 150, was attached to the ring by loosely coupled quartz fingers, 151. The roller was then attached to a rod which exited the apparatus and allowed externally stimulated movement of the quartz translator. The major surface of the levitation track and frit was mounted horizontally. The entire levitation track/frit component was surrounded by a quartz reactor tube, 160, with the gas inlets for growth chambers, 130 and 120, and the levitation track, 110, exiting at 161, 162, and 163, respectively, and the exhaust outlet exiting at 164.

The rod, 170, was withdrawn until the quartz translator was opposite loading port, 180. The loading port cap was removed, the substrate was then inserted through this loading port and positioned within the ambit of the translator, and the cap replaced. The helium flow was continued for approximately another 5 minutes. The helium flow through inlet tubes, 161 and 162, was then terminated, and a flow of approximately 1,500 sccm of hydrogen was established in each inlet tube. The initially established flow of gas through inlet, 163, of the levitation track was increased from 1,000 sccm of hydrogen to 50,000 sccm of a nitrogen/hydrogen mixture (98 percent nitrogen). This increased flow levitates the substrate until it is completely free of contact with the levitation track.

Figure 9:
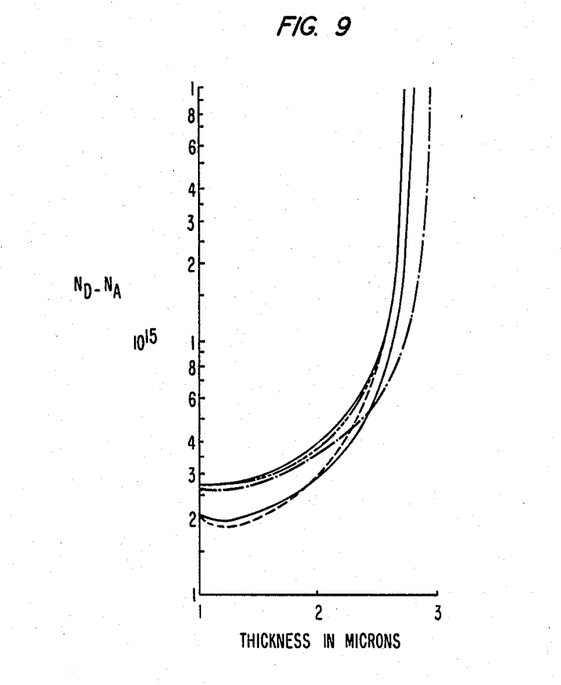

The translator was moved so that the substrate was positioned at approximately position, 165, that is at the edge of furnace, 190. The furnace was adjusted to a temperature of approximately 680 degrees C. at the positions of the growth chambers. Approximately 300 sccm of the hydrogen being directed to the frit inlet was then diverted through a bubbler containing arsenic trichloride held at 18 degrees C. and then passed over a fused quartz boat containing gallium held at 800 degrees C. before it was recombined with the flow entering inlet tube, 162 and chamber, 120. Similarly, 150 sccm of the hydrogen flow was diverted through a second bubbler containing arsenic trichloride held at 18 degrees C. and was recombined with the hydrogen flow entering inlet tube, 162. The newly established flow was allowed to equilibrate for approximately 5 minutes. The substrate was then moved with the translator to position, 166, and thus levitated by the newly established flow. After 30 minutes, the translator was again moved to the loading port and removed. The resulting treatment yielded a gallium arsenide layer having a thickness of approximately 3 µm. The grown layer was subjected to standard cleave and stain measurement techniques, and these techniques showed no detectable compositional or thickness non-uniformities. The dopant and thickness uniformity measured with a Miller profiler is shown in FIG. 9 where the curves respectively correspond to volume underlying four equally spaced points on the substrate periphery and a point at the center of the substrate.

EXAMPLE 2

The procedure of Example 1 was followed, except the deposition gas flow was initially produced by diverting (1) 310 sccm of hydrogen through an arsenic trichloride bubbler and over the gallium containing boat while also diverting (2) 930 sccm of hydrogen through an arsenic trichloride bubbler. Additionally, a second flow was routed through frit area, 130, at position, 167. This flow was produced by diverting 300 sccm of hydrogen through an arsenic trichloride bubbler (18 degrees C.) and over a gallium containing boat at 800 degrees C. while diverting 150 sccm of hydrogen (from a total flow of 3,000 sccm) through the second arsenic trichloride bubbler. The substrate was translated over frit position, 166, and kept there for 3 minutes. After this period, the substrate was then again moved with the translator over frit position, 167, for 10 minutes. During this 10-minute growth interval, the gas flow through frit area, 166, was modified by flowing 300 sccm (rather than 310 sccm) of hydrogen through one bubbler and over the gallium boat while diverting 150 sccm (rather than 930 sccm) of hydrogen through the second bubbler. Additionally, a sufficient volume of a gas formed from 600 parts/million of hydrogen sulfide in hydrogen was added into the gas flow to yield a majority carrier concentration in the final deposited layer of approximately $3 \times 10^{16}$ cm$^{-3}$. The substrate was moved with the translator back to position, 166, and maintained there for a period of 3 minutes before withdrawing it to the position in front of port, 180.

The initial flow through area, 166, produced an in situ etch while the subsequent deposition from the flow through area, 167, produced an undoped buffer layer with a carrier concentration lower than $10^{13}$ cm$^{-3}$—the detection limit of a Miller feedback profiler. The third growth initiated during the second interval at position, 166, produced a doped gallium arsenide region. The thickness uniformity was less than ±2 percent.

EXAMPLE 3

Figure 10:
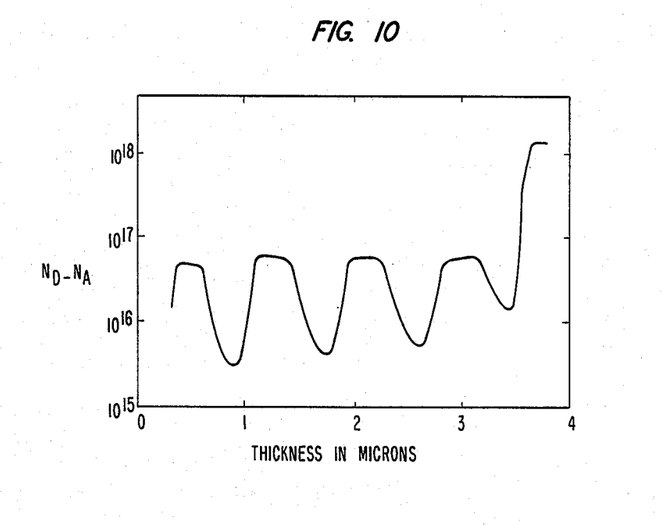

The procedure of Example 2 was followed, except various indium phosphide regions were grown on an indium phosphide substrate. The indium phosphide substrate had its major surface canted 3 degrees from the [100] plane toward the [110] plane. Initially, the total hydrogen flow established through each frit region was approximately 1,500 sccm. After the initial hydrogen flow was established, approximately 300 sccm of the hydrogen reaching inlet, 162, was diverted through a phosphorus trichloride bubbler held at −12 degrees C. and then over a quartz boat containing indium at a temperature of 750 degrees C. Additionally, 50 sccm of this hydrogen flow was diverted through a second phosphorus trichloride bubbler held at −12 degrees C. and recombined with the hydrogen flow entering inlet, 162. The substrate was introduced into frit area, 166, at 680 degrees C. and treated with the combined flow for 1½ minutes. The initial flow through frit area, 166, was then replaced by a total hydrogen flow of 1,500 sccm where 240 sccm of this hydrogen was diverted through a phosphorus trichloride bubbler at −12 degrees C. and over an indium containing boat at 750 degrees C. while 80 sccm was diverted through a phosphorus trichloride boat at −17 degrees C. and over a boat containing polycrystalline indium phosphide at 750 degrees C. This new flow was maintained for 45 minutes. During this 45-minute growth period at 5-minute intervals, a 600 parts hydrogen sulfide to 1,000,000 parts hydrogen mixture was introduced into the gas flow for several 5-minute intervals. Sufficient hydrogen sulfide was introduced to yield the doping profile shown in FIG. 10. As can be seen from the Figure, sharply defined regions of indium phosphide and doped indium phosphide were produced. (It should be noted that the first gas flow utilized was introduced to provide an in situ etch.)

EXAMPLE 4

The procedure of Example 3 was followed, except the growth interval utilized was 74 minutes rather than 45 minutes, and no hydrogen sulfide was introduced. The layer produced had a nominal carrier concentration of $2 \times 10^{15}$ cm$^{-3}$.

EXAMPLE 5

Figure 11:
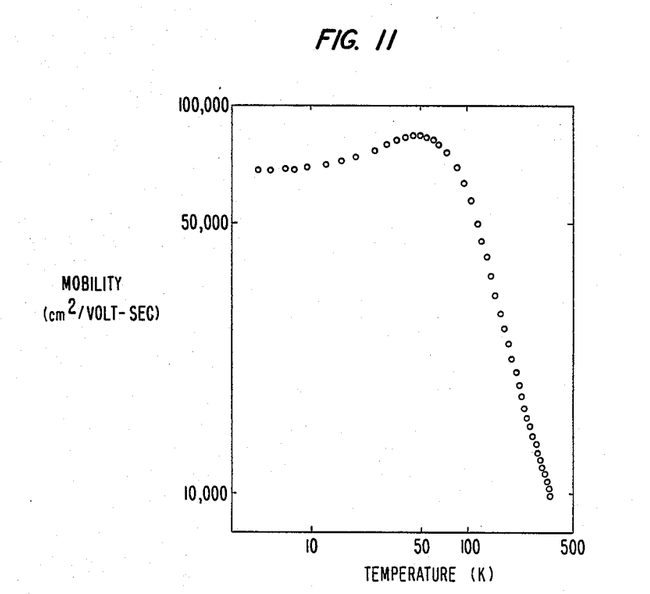

The procedure of Example 3 was followed, except the indium phosphide substrate included an iron dopant concentration sufficient to make the substrate semiinsulating. The major surface of the substrate was oriented 2½ degrees from the [100] plane toward the [110] plane. The initial flow through the frit area, 166, was the same as in Example 3. When this flow was established, a second flow through frit area, 167, was also established. This second flow was produced by diverting from a total hydrogen flow of 1,500 sccm, 90 sccm through an arsenic trichloride bubbler at 11 degrees C., and then over a gallium arsenide containing boat at 750 degrees C., while also diverting 300 sccm through an arsenic trichloride bubbler held at 18 degrees C. and then over an indium containing boat at 750 degrees C. After initially treating the substrate in frit area, 166, for 1½ minutes, the substrate was transferred to frit area, 167, for 60 minutes and then removed from the furnace. The procedure resulted in an indium gallium arsenide layer that was essentially completely lattice matched to the indium phosphide substrate, that had a thickness of approximately 3 μm, and that had a mobility as a function of temperature, as shown in FIG. 11.

EXAMPLE 6

Figure 12:
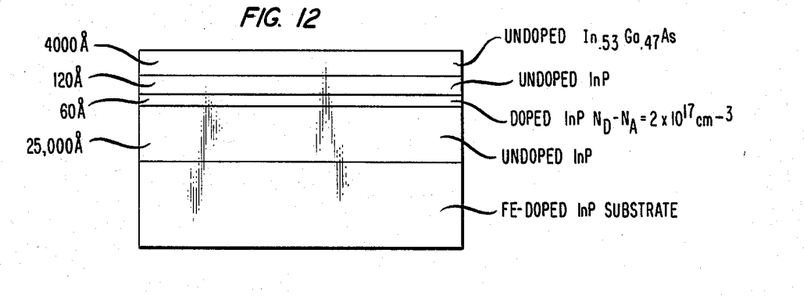
Figure 13:
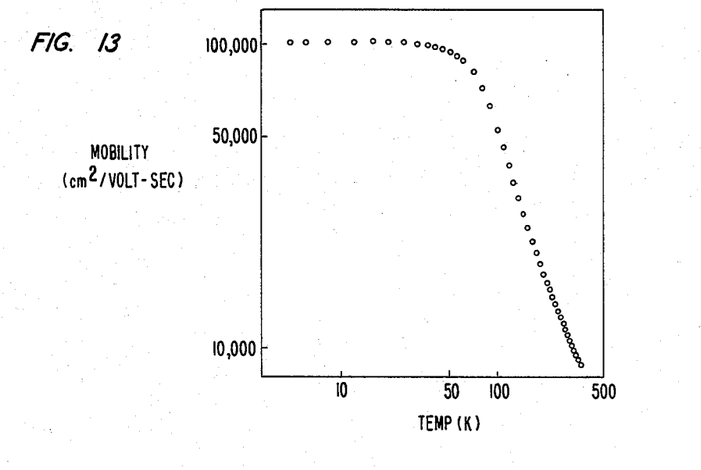

The procedure of Example 5 was followed, with the initial etch interval again being 1½ minutes. However, after this 1½ minute etch, the flow in frit area, 166, was reestablished by diverting 300 sccm (from a total of 1,500 sccm of hydrogen) through a phosphorus trichloride bubbler at −18 degrees C. and then over an indium containing boat at 750 degrees C. Additionally, 30 sccm of this 1,500 sccm flow was also diverted through a phosphorus trichloride bubbler at −18 degrees C. and then over a boat containing polycrystalline indium phosphide at 750 degrees C. After this 30-minute growth period, a 600 parts/million hydrogen sulfide in hydrogen flow was added for 5 seconds into inlet, 162, to produce an n-type deposited region of approximately 60 Angstroms thickness. After the 5-second interval, the hydrogen sulfide flow was terminated for approximately 10 seconds, resulting in an undoped deposited region of approximately 120 Angstroms. The substrate was then moved to frit area, 167, where the flow had been modified by diverting from a total hydrogen flow of 1,500 sccm approximately 85 sccm, passing this aliquot through an arsenic trichloride bubbler at 10 degrees C., and then passing it over a gallium arsenide containing boat (750 degrees C.) while diverting 300 sccm through an arsenic trichloride bubbler at 18 degrees C. and over an indium containing boat at 750 degrees C. The substrate was maintained in frit position, 167, for 8 minutes and then removed from tg boat at 750 degrees C. The substrate was maintained in frit position, 167, for 8 minutes and then removed from the furnace. The structure shown in FIG. 12 was produced. The mobility of this structure is shown in FIG. 13, as measured by standard Hall mobility techniques as a function of temperature.

What is claimed is:

1. A process for forming a material layer on a surface of a substrate comprising the steps of forming a precursor gaseous flow and directing said flow with a directing means to contact said substrate, thereby inducing formation of said material layer characterized in that (1) said surface of said substrate is, during said formation, spaced an average distance less than ¼ the substrate effective radius from a directing surface defined from said directing means by translating an incompressible imaginary sphere having a diameter of 1/10 the substrate effective radius along all accessible surfaces of said directing means and (2) at least 50 percent of said gas flow that contacts said substrate undergoes said contact initially at an interior point of said surface of said surface before it cuts a plane that is tangent to the periphery of said substrate and normal to the surface of said substrate upon which deposition is desired.

2. The process of claim 1 wherein said directing means comprises a frit.

3. The process of claim 2 wherein said average distance between said substrate surface and said directing surface is less than 1/10 the substrate radius.

4. The process of claim 2 wherein said material layer comprises a III-V semiconductor material.

5. The process of claim 4 wherein said substrate comprises a member chosen from the group consisting of indium phosphide and gallium arsenide.

6. The process of claim 4 wherein said III-V semiconductor material comprises a composition chosen from the group consisting of indium phosphide, gallium arsenide, gallium indium arsenide phosphide, and gallium indium arsenide.

7. The process of claim 6 wherein said substrate comprises indium phosphide.

8. The process of claim 6 wherein said substrate comprises gallium arsenide.

9. The process of claim 1 wherein said distance between said substrate surface and said directing surface is less than 1/10 the effective substrate radius.

10. The process of claim 9 wherein said distance between said substrate surface and said directing surface is less than 1/100 the effective substrate radius.

11. The process of claim 2 wherein said substrate is levitated above said frit.

* * * * *